US009811169B2

(12) United States Patent
Song et al.

(10) Patent No.: US 9,811,169 B2
(45) Date of Patent: Nov. 7, 2017

(54) FLEXIBLE ARRAY SUBSTRATE, DISPLAY PANEL HAVING THE SAME, KEYBOARD ASSEMBLY, AND ELECTRONIC DEVICE THEREOF

(71) Applicant: BOE TECHNOLOGY GROUP CO., LTD., Beijing (CN)

(72) Inventors: Song Song, Beijing (CN); Kazuyoshi Nagayama, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/035,755

(22) PCT Filed: Dec. 10, 2015

(86) PCT No.: PCT/CN2015/097038
§ 371 (c)(1),
(2) Date: May 11, 2016

(87) PCT Pub. No.: WO2016/180014
PCT Pub. Date: Nov. 17, 2016

(65) Prior Publication Data
US 2017/0123506 A1    May 4, 2017

(30) Foreign Application Priority Data
May 11, 2015    (CN) .......................... 2015 1 0236600

(51) Int. Cl.
*G09G 3/20*    (2006.01)
*G06F 3/038*    (2013.01)
(Continued)

(52) U.S. Cl.
CPC ........... *G06F 3/023* (2013.01); *G09G 3/2092* (2013.01); *G09G 2300/0426* (2013.01); *G09G 2380/02* (2013.01)

(58) Field of Classification Search
CPC ............ H01L 51/0097; H01L 27/3276; G06F 3/0412
See application file for complete search history.

(56) References Cited

U.S. PATENT DOCUMENTS 7,667,962 B2 *    2/2010    Mullen ................. G06F 1/1624
                                                              359/461
2004/0239586 A1 *    12/2004    Cok ..................... G09G 3/3266
                                                              345/55
(Continued)

FOREIGN PATENT DOCUMENTS

CN        101487962 A        7/2009
CN        101582422 A        11/2009
(Continued)

OTHER PUBLICATIONS

International Search Report & Written Opinion dated Mar. 18, 2016 regarding PCT/CN2015/097038.
(Continued)

*Primary Examiner* — Nan-Ying Yang
(74) *Attorney, Agent, or Firm* — Intellectual Valley Law, P.C.

(57) ABSTRACT

The present application discloses a flexible array substrate comprising a flexible display portion comprising a plurality of first signal lines and a plurality of second signal lines intersecting each other; a flexible circuit bonding portion abutting the flexible display portion for bonding circuit parts; and a plurality of first connection lines for transmitting first signals to the plurality of first signal lines. Each of the plurality of first connection lines connects with a corresponding first signal line, and extends from the flexible display portion to the flexible circuit bonding portion. Each of the plurality of first connection lines crosses over at least one other first signal line within the flexible display portion.

20 Claims, 4 Drawing Sheets

(51) Int. Cl.
G09G 5/00 (2006.01)
G06F 3/023 (2006.01)

(56) References Cited

U.S. PATENT DOCUMENTS

| | | | |
|---|---|---|---|
| 2011/0279418 A1 | 11/2011 | Han et al. | |
| 2013/0277650 A1* | 10/2013 | Yoneya | H01L 27/3276 257/40 |
| 2015/0022561 A1* | 1/2015 | Ikeda | G06F 1/1652 345/690 |

FOREIGN PATENT DOCUMENTS

| | | |
|---|---|---|
| CN | 102543028 A | 7/2012 |
| CN | 102621758 A | 8/2012 |
| CN | 103699255 A | 4/2014 |
| CN | 104103669 A | 10/2014 |
| CN | 104253147 A | 12/2014 |
| CN | 104575349 A | 4/2015 |
| CN | 104952883 A | 9/2015 |
| JP | H08286202 A | 11/1996 |

OTHER PUBLICATIONS

First Office Action in the Chinese Patent Application No. 201510236600.2, dated Jul. 5, 2017; English translation attached.

* cited by examiner

FLEXIBLE ARRAY SUBSTRATE, DISPLAY PANEL HAVING THE SAME, KEYBOARD ASSEMBLY, AND ELECTRONIC DEVICE THEREOF

CROSS-REFERENCE TO RELATED APPLICATION

This application is a national stage application under 35 U.S.C. §371 of International Application No. PCT/CN2015/097038 filed Dec. 10, 2015, which claims priority to Chinese Patent Application No. 201510236600.2, filed May 11, 2015, the contents of which are incorporated by reference in the entirety.

FIELD

The present invention relates to display technology, more particularly, to a flexible array substrate, a display panel having the same, a keyboard assembly, and an electronic device thereof.

BACKGROUND

A flexible display device is a bendable or deformable display device having a flexible display panel. Examples of flexible display devices include a flexible organic light emitting display (OLED) device, a flexible electrophoretic display (EPD) device, and a flexible liquid crystal display (LCD) device. As a new generation display device, the flexible display device is thinner and lighter, having high contrast, high responsiveness, and high brightness. It also provides full color and a wide viewing angle. The flexible display device has found a wide range of applications in mobiles phones, personal digital assistance (PDAs), digital cameras, on-board displays, notebook computers, on-wall televisions, as well as various military applications. A flexible display device includes a flexible array substrate. A base substrate of the flexible array substrate can be made of flexible material such as plastic.

SUMMARY

In one aspect, the present invention provides a flexible array substrate comprising a flexible display portion comprising a plurality of first signal lines and a plurality of second signal lines intersecting each other; a flexible circuit bonding portion abutting the flexible display portion for bonding circuit parts; and a plurality of first connection lines for transmitting first signals to the plurality of first signal lines. Each of the plurality of first connection lines connects with a corresponding first signal line, and extends from the flexible display portion to the flexible circuit bonding portion. Each of the plurality of first connection lines crosses over at least one other first signal line within the flexible display portion.

Optionally, the plurality of first connection lines in the flexible display portion are substantially parallel to the plurality of second signal lines.

Optionally, the flexible array substrate further comprises a plurality of second connection lines for transmitting second signals to the plurality of second signal lines.

Optionally, the plurality of first signal lines is a plurality of data lines, and the plurality of first connection lines is a plurality of data connection lines.

Optionally, a plurality of first terminals of the plurality of first connection lines are connected to the plurality of first signal lines, a plurality of second terminals of the plurality of first connection lines are in the flexible circuit bonding portion for receiving first signals; and a plurality of first terminals of the plurality of second connection lines are connected to the plurality of second signal lines, a plurality of second terminals of the second connection lines are in the flexible circuit bonding portion for receiving second signals.

Optionally, the flexible array substrate further comprises a first layer comprising the plurality of first connection lines and the plurality of second signal lines; a second layer comprising the plurality of second connection lines and the plurality of first signal lines; and an insulating layer between the first layer and the second layer. Each of the plurality of first terminals of the plurality of first connection lines is connected to the corresponding first signal line through a first via in the insulating layer in a one-on-one relationship. Each of the plurality of first terminals of the second connection lines is connected to a corresponding second signal line through a second via in the insulating layer in a one-on-one relationship.

Optionally, the plurality of first signal lines are a plurality of data lines, the plurality of second signal lines are a plurality of gate lines, the plurality of first connection lines are a plurality of data connection line, the plurality of second connection lines are a plurality of gate connection lines; the plurality of data lines extend along a first direction from the flexible display portion into the flexible circuit bonding portion; the plurality of second terminals of the plurality of data connection lines are connected to a data driven control chip interface through a first electrical terminal; and the plurality of gate lines extend along a second direction; the flexible circuit bonding portion comprises a first edge and a second edge along the second direction, the first electrical terminal is on the first edge, lengths of the plurality of data lines within the flexible circuit bonding portion increase along a direction from the first edge to the second edge.

Optionally, the plurality of first signal lines are a plurality of data lines, the plurality of second signal lines are a plurality of gate lines, the plurality of first connection lines are a plurality of data connection line, the plurality of second connection lines are a plurality of gate connection lines; the plurality of data lines extend along a first direction from the flexible display portion into the flexible circuit bonding portion; the plurality of second terminals of the plurality of data connection lines are connected to a first data driven control chip interface through a first electrical terminal and a second data driven control chip interface through a second electrical terminal; and the plurality of gate lines extend along a second direction; the flexible circuit bonding portion comprises a first edge and a second edge along the second direction, the first electrical terminal is on the first edge and the second electrical terminal is on the second edge, lengths of the plurality of data lines within the flexible circuit bonding portion decrease along a direction from a center of the flexible circuit bonding portion to the first edge and to the second edge, respectively.

Optionally, the flexible circuit bonding portion comprises a gate-driver on array (GOA) circuit, the plurality of gate connection lines are substantially parallel to the plurality of data lines, the plurality of second terminals of the plurality of gate connection lines are connected to the GOA circuit, the GOA circuit is connected to a GOA signal input line, and the GOA signal input line is substantially parallel to the plurality of data connection lines.

Optionally, the plurality of gate lines extend along a second direction; lengths of the plurality of gate connection lines increase along the second direction.

Optionally, the plurality of first signal lines are a plurality of data lines, the plurality of second signal lines are a plurality of gate lines, the plurality of first connection lines are a plurality of data connection line, the plurality of second connection lines are a plurality of gate connection lines; the plurality of gate lines extend along a first direction from the flexible display portion toward the flexible circuit bonding portion; each of the plurality of data connection lines has a substantially L shape, comprising a first segment and a second segment substantially perpendicular to each other; and a plurality of the first segments are substantially parallel to the plurality of gate lines and extending into the flexible display portion, each of the plurality of the first segments is connected to the corresponding data line through a first via in the insulating layer in a one-on-one relationship.

Optionally, the plurality of the second segments comprises the plurality of second terminals of the plurality of data connection lines, and the plurality of second terminals of the plurality of data connection lines are connected to a data driven control chip interface through a first electrical terminal; and the plurality of data lines extend along a second direction; the flexible circuit bonding portion comprises a first edge and a second edge along the second direction, the first electrical terminal is on the first edge, lengths of the plurality of the first segments and the plurality of the second segments within the flexible circuit bonding portion increase along a direction from the first edge to the second edge.

Optionally, the plurality of the second segments comprises the plurality of second terminals of the plurality of data connection lines, and the plurality of second terminals of the plurality of data connection lines are connected to a first data driven control chip interface through a first electrical terminal and a second data driven control chip interface through a second electrical terminal; the plurality of data lines extend along a second direction; the flexible circuit bonding portion comprises a first edge and a second edge along the second direction, the first electrical terminal is on the first edge and the second electrical terminal is on the second edge, lengths of the plurality of the first segments and the plurality of the second segments within the flexible circuit bonding portion decrease along a direction from a center of the flexible circuit bonding portion to the first edge and the second edge.

Optionally, the flexible circuit bonding portion comprises a GOA circuit, the plurality of second terminals of the plurality of gate connection line are connected to the GOA circuit, the GOA circuit is connected to a GOA signal input line, and the GOA signal input line is substantially parallel to the plurality of data connection lines.

In another aspect, the present invention provides a display panel comprising a flexible array substrate described herein and a data driven control chip.

Optionally, the data driven control chip is connected to the plurality of second terminals of a plurality of data connection lines through an electrical terminal.

Optionally, the data driven control chip is integrated in an external control chip, the flexible circuit bonding portion comprises a GOA circuit, the GOA circuit is connected to a GOA signal input line, the external control chip is connected through flexible printed circuit boards to the electrical terminal and to the GOA signal input line, respectively.

Optionally, the flexible circuit bonding portion has the electrical terminal on one or both ends, an edge of the electrical terminal is coterminous with a boundary between the flexible display portion and the flexible circuit bonding portion, the external control chip is folded behind the flexible circuit bonding portion, the external control chip and the flexible circuit bonding portion are packaged together using a flexible module, and the external control chip comprises a contact lead wire protruding out of the flexible module for connecting with an external module.

Optionally, the display panel further comprises a frame along one portion of the flexible array substrate, the one portion is a portion having the flexible circuit bonding portion.

Optionally, the display panel is a touch control display panel.

In another aspect, the present invention further provides a keyboard assembly comprising a keyboard portion; and a display connection portion comprising a groove formed between two opposing rows of pinch points for receiving a flexible circuit bonding portion of a flexible array substrate described herein.

Optionally, the two opposing rows of pinch points comprise a plurality of pairs of pinch points extendable toward each other for changing the shape of the groove.

Optionally, the display connection portion comprises a contact lead wire receiving portion for receiving a contact lead wire on two edges of the flexible circuit bonding portion of the flexible array substrate.

Optionally, the display connection portion comprises an arc-shape track, the contact lead wire receiving portion protruding out of the arc-shape track and is movable along the arc-shape track.

In another aspect, the present invention further provides an electronic device comprising a display panel described herein and a keyboard assembly described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

Figure 1:
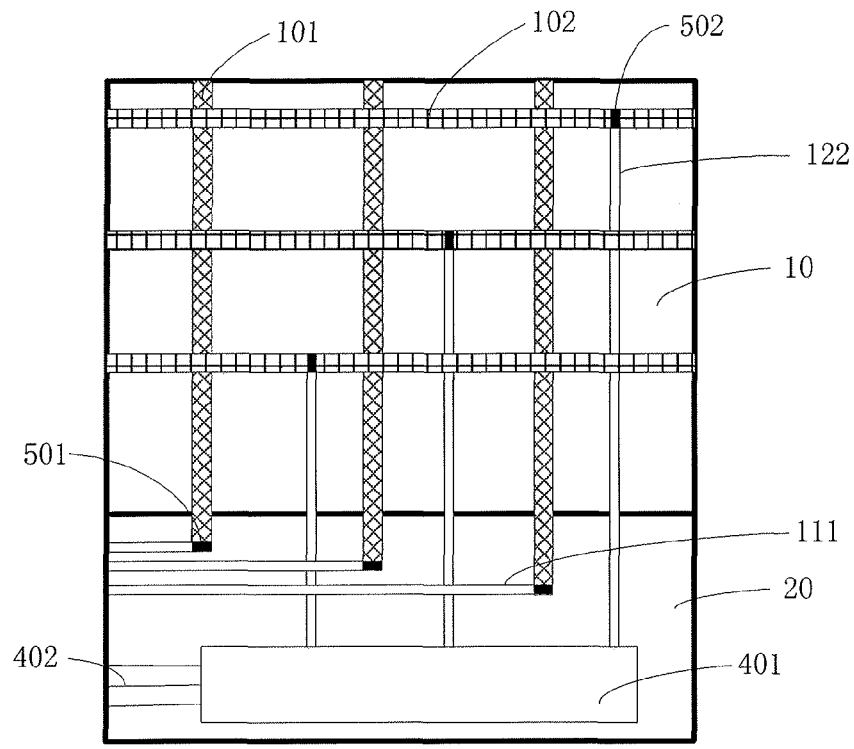
FIG. 1 is a diagram illustrating the structure of a flexible array substrate in an embodiment.

The disclosure will now describe more specifically with reference to the following embodiments. It is to be noted that the following descriptions of some embodiments are presented herein for purpose of illustration and description only.

It is not intended to be exhaustive or to be limited to the precise form disclosed.

In one aspect, the present disclosure provides a flexible array substrate. In some embodiments, the flexible array substrate includes a flexible display portion having a plurality of first signal lines and a plurality of second signal lines intersecting each other, and a flexible circuit bonding portion abutting the flexible display portion for bonding circuit parts. The flexible array substrate further includes a plurality of first connection lines for transmitting first signals to the plurality of first signal lines. Each of the plurality of first connection lines connects with a corresponding first signal line, and extends from the flexible display portion (e.g., the connecting point) to the flexible circuit bonding portion.

In some embodiments, at least one (e.g., at least some) of the plurality of first connection lines crosses over at least one other first signal line within the flexible display portion. Optionally, the at least one of the plurality of first connection lines crosses over a plurality of first signal lines within the flexible display portion located between the corresponding first signal line and the flexible circuit bonding portion.

In some embodiments, the flexible array substrate further includes a plurality of second connection lines for transmitting second signals to the plurality of second signal lines.

Optionally, the plurality of first connection lines in the flexible display portion are substantially parallel to the plurality of second signal lines. Optionally, the plurality of second connection lines in the flexible display portion are substantially parallel to the plurality of first signal lines.

In some embodiments, a plurality of first terminals of the plurality of first connection lines are connected to the plurality of first signal lines. Optionally, a plurality of second terminals of the plurality of first connection lines are in the flexible circuit bonding portion for receiving first signals. In some embodiments, a plurality of first terminals of the plurality of second connection lines are connected to the plurality of second signal lines. Optionally, a plurality of second terminals of the second connection lines are in the flexible circuit bonding portion for receiving second signals.

In some embodiments, the flexible array substrate includes a first layer having the plurality of first connection lines and the plurality of second signal lines, a second layer having the plurality of second connection lines and the plurality of first signal lines, and an insulating layer between the first layer and the second layer. Optionally, each of the plurality of first terminals of the plurality of first connection lines is connected to a corresponding first signal line through a first via in the insulating layer in a one-on-one relationship. Optionally, each of the plurality of first terminals of the second connection lines is connected to a corresponding second signal line through a second via in the insulating layer in a one-on-one relationship.

In some embodiments, the flexible array substrate includes a flexible display portion having a plurality of first signal lines and a plurality of second signal lines intersecting each other, a flexible circuit bonding portion abutting a portion of a periphery (e.g., only an edge) of the display portion, forming a boundary region between the flexible display portion and the flexible circuit bonding portion. The flexible array substrate further includes a plurality of first connection lines for transmitting first signals to the plurality of first signal lines. Optionally, each of the plurality of first connection lines extends from the flexible non-display portion to the flexible circuit bonding portion, intersecting the boundary region. Optionally, the flexible array substrate further includes a plurality of second connection lines for transmitting second signals to the plurality of second signal lines. Each of the plurality of second connection lines the flexible display portion extends from the flexible non-display portion to the flexible circuit bonding portion, intersecting the boundary region. Optionally, intersecting points of the plurality of first connection lines and intersecting points of the plurality of second connection lines intermix in the boundary region. Optionally, the intersecting points of the plurality of first connection lines and the intersecting points of the plurality of second connection line in the boundary region are alternately arranged.

Optionally, the plurality of first signal lines are a plurality of data lines, and the plurality of first connection lines are a plurality of data connection lines. Optionally, the plurality of second signal lines are a plurality of gate lines, and the plurality of second connection lines are a plurality of gate connection lines. Optionally, the plurality of first signal lines are a plurality of data lines, the plurality of second signal lines are a plurality of gate lines, the plurality of first connection lines are a plurality of data connection line, the plurality of second connection lines are a plurality of gate connection lines. Optionally, the first signals are data signals. Optionally, the second signals are gate driving signals.

FIG. 1 is a diagram illustrating the structure of a flexible array substrate in an embodiment. Referring to FIG. 1, the flexible array substrate in the embodiment includes a flexible display portion 10 and a flexible circuit bonding portion 20 abutting the flexible display portion 10. Optionally, the flexible array substrate includes a flexible circuit bonding portion 20 abutting only one portion (e.g., one edge) of the flexible display portion 10. The flexible display portion includes a plurality of data lines 101 and a plurality of gate lines 102 intersecting each other. The flexible array substrate further includes a plurality of data connection lines 111 for transmitting data signals to the plurality of data lines 101, and a plurality of gate connection lines 122 for transmitting gate driving signals to the plurality of gate lines 102. A plurality of first terminals of the plurality of data connection lines 111 are connected to the plurality of data lines 101. A plurality of second terminals of the plurality of data connection lines 111 are in the flexible circuit bonding portion 20 for receiving the data signals. A plurality of first terminals of the plurality of gate connection lines 122 are connected to the plurality of gate lines 102. A plurality of second terminals of the gate connection lines 122 are in the flexible circuit bonding portion 20 for receiving the gate driving signals.

By having the flexible circuit bonding portion 20 abutting a portion of a periphery (e.g., only one edge) of the display portion 10 and having the terminals of the data connection lines 111 and the terminals of the gate connection lines 122 within the flexible circuit bonding portion 20, a display panel having a frame on only one portion of the periphery of the display portion can be made. For example, by having this design, three edges of the display portion can be frameless, the display panel includes a frame along only one edge of the flexible array substrate, i.e., the edge abutting the flexible circuit bonding portion.

Figure 2:
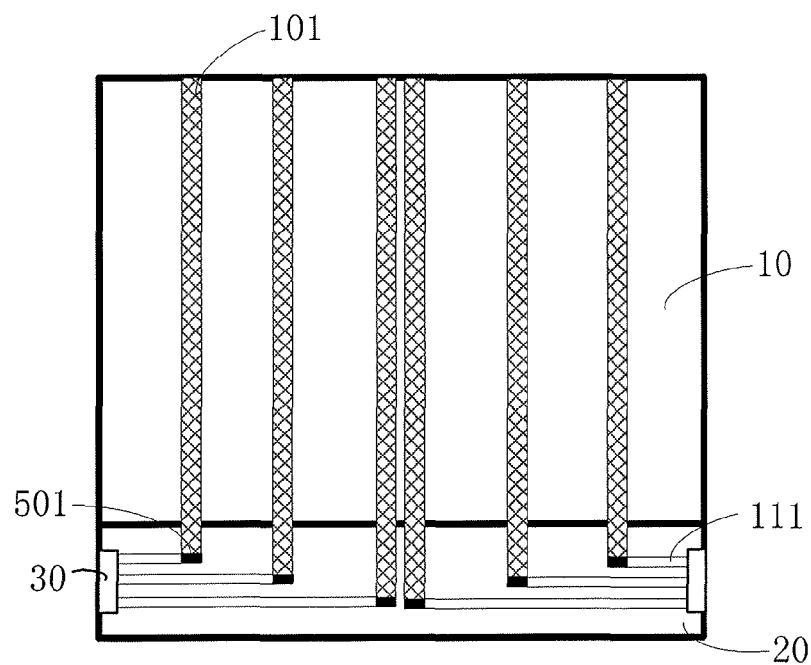
FIG. 2 is an electrical wiring schematic diagram of a plurality of data lines and a plurality of data connection lines in a flexible array substrate in an embodiment.

In some embodiments, the plurality of data lines 101 extend along a first direction from the display portion 10 into the flexible circuit bonding portion 20. FIG. 2 is an electrical wiring schematic diagram of a plurality of data lines 101 and a plurality of data connection lines 111 in a flexible array substrate in an embodiment. Referring to FIG. 2, the plurality of data lines 101 extend along a first direction (e.g., the vertical direction in FIG. 2) from the display portion 10 into the flexible circuit bonding portion 20. The plurality of second terminals of the plurality of data connection lines 111 are connected to a data driven control chip interface through an electrical terminal 30. The plurality of gate lines 102 extend along a second direction (e.g., the horizontal direction in FIG. 2). The flexible circuit bonding portion includes a first edge and a second edge along the second direction (e.g., the left end and the right end in FIG. 2).

Optionally, the flexible circuit bonding portion 20 contains a first electrical terminal 30 on the first edge and a second electrical terminal 30 on the second edge of the flexible circuit bonding portion 20. Lengths of the plurality of data lines 101 within the flexible circuit bonding portion 20 decrease along a direction from the center of the flexible circuit bonding portion 20 to the first edge and to the second edge of the flexible circuit bonding portion 20, respectively.

Optionally, the electrical terminals 30 is only on the first edge of the flexible circuit bonding portion 20. Lengths of the plurality of data lines 101 within the flexible circuit bonding portion 20 increase along a direction from the first edge to the second edge.

Figure 3:
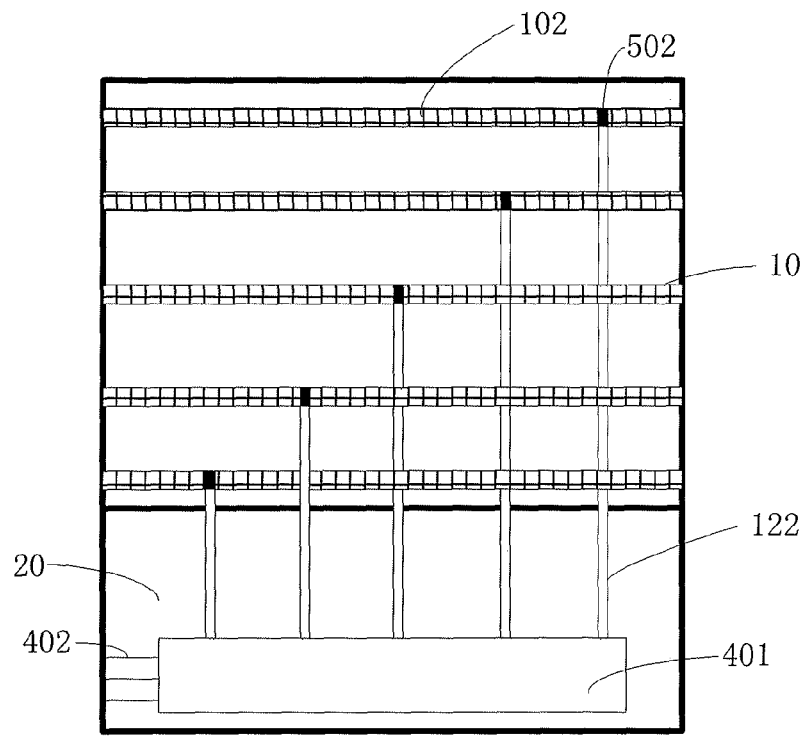
FIG. 3 is an electrical wiring schematic diagram of a plurality of gate lines and a plurality of gate connection lines in a flexible array substrate in an embodiment.

In some embodiments, the flexible circuit bonding portion 20 further includes a gate-driver on array (GOA) circuit 401. FIG. 3 is an electrical wiring schematic diagram of a plurality of gate lines and a plurality of gate connection lines in a flexible array substrate in an embodiment. Referring to FIG. 3, the array substrate includes a plurality of gate connection lines 122. The plurality of gate connection lines 122 are substantially parallel to the plurality of data lines 101 (not shown in FIG. 3; see data lines 101 in FIG. 2). The plurality of second terminals of the plurality of gate connection lines 122 are connected to the GOA circuit 401. The GOA circuit 401 is connected to a GOA signal input line 402. The GOA signal input line 402 is substantially parallel to the plurality of data connection lines 111 (not shown in FIG. 3; see data connection lines 111 in FIG. 2). Optionally, lengths of the plurality of gate connection lines 122 increase along the second direction (e.g., the horizontal direction in FIG. 2).

Figure 4:
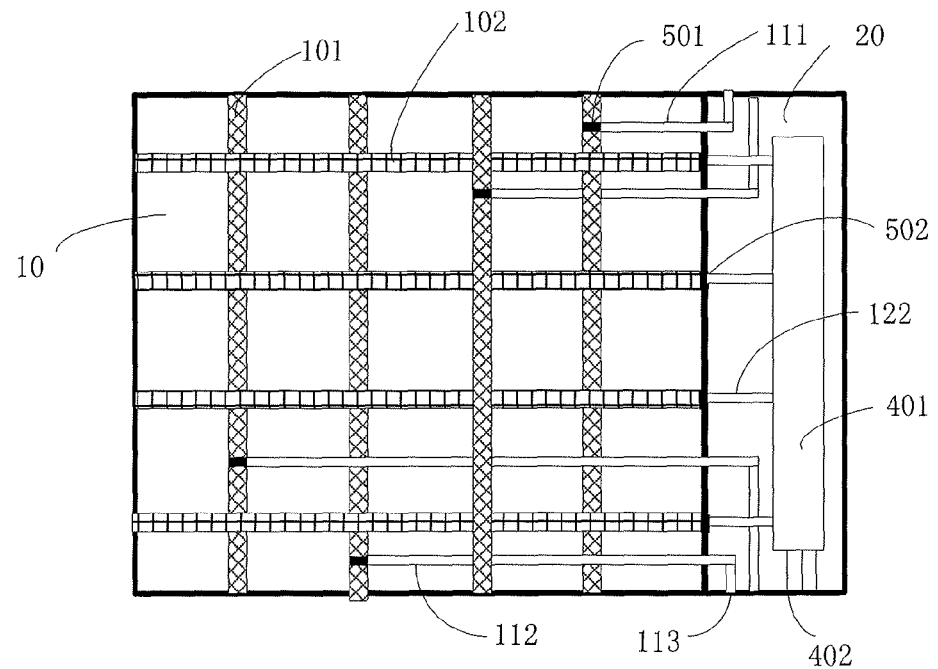
FIG. 4 is a diagram illustrating the structure of a flexible array substrate in another embodiment.

In some embodiments, the plurality of gate lines 102 extend along a first direction from the display portion 10 into the flexible circuit bonding portion 20. FIG. 4 is a diagram illustrating the structure of a flexible array substrate in another embodiment. Referring to FIG. 4, each of the plurality of data connection lines 111 has a substantially L shape. Each of the data connection lines 111 includes a first segment 112 and a second segment 113 substantially perpendicular to each other. A plurality of the first segments 112 are substantially parallel to the plurality of gate lines 102 and extending into the display portion 10. Each of the plurality of the first segments 112 is connected to a corresponding data lines 101 through a first via 501 in a one-on-one relationship. The plurality of the second segments 113 includes the plurality of the second terminals of the plurality of data connection lines 111. The plurality of second terminals are connected to a data driven control chip interface through an electrical terminal 30.

Optionally, the plurality of data lines 101 extend along a second direction. The flexible circuit bonding portion 20 includes a first edge and a second edge along the second direction (e.g., the upper end and the lower end in FIG. 4). The flexible circuit bonding portion 20 includes a first electrical terminal 30 on the first edge and a second electrical terminal 30 on the second edge (not shown in FIG. 4; see, e.g., two electrical terminals 30 in FIG. 5) for connecting a data driven control chip interface. Lengths of the plurality of the first segments 112 and the plurality of the second segments 113 within the flexible circuit bonding portion 20 decrease along a direction from the center of the flexible circuit bonding portion 20 to the first edge and the second edge, respectively.

Optionally, the plurality of data lines 101 extend along a second direction. The flexible circuit bonding portion 20 includes a first edge and a second edge along the second direction. The flexible circuit bonding portion 20 includes only one electrical terminal 30 on the first edge for connecting a data driven control chip interface. Lengths of the plurality of the first segments 112 and the plurality of the second segments 113 within the flexible circuit bonding portion 20 increase along a direction from the first edge to the second edge.

In some embodiments, the flexible circuit bonding portion 20 further includes a GOA circuit 401. The plurality of second terminals of the gate connection line 122 are connected to the GOA circuit 401. The GOA circuit 401 is connected to a GOA signal input line 402. The GOA signal input line 402 is substantially parallel to the plurality of data connection lines 111.

Typically, there are more data lines 101 than gate lines 102 in a flexible array substrate. Accordingly, two electrical terminal 30 can be arranged on the first edge and the second edge of the flexible circuit bonding portion. The data connection lines 111 can be partitioned into two parts for wiring on the flexible circuit bonding portion. This reduces the space occupied by the data connection lines 111. The flexible circuit bonding portion 20 can be better utilized, and the total non-display portion can be further reduced.

In some embodiments, the GOA circuit 401 may be disposed on the bottom of the flexible circuit bonding portion 20, extending along an edge of the flexible circuit bonding portion 20 distal to the edge abutting the display portion 10. This structure can avoid the gate connection lines 122 overlapping with other wires multiple times, further reducing the space occupied by the GOA circuit 401 in the flexible circuit bonding portion 20. The flexible circuit bonding portion 20 can be better utilized, and the electrical wiring design on the flexible circuit bonding portion 20 can be optimized.

In some embodiments, the flexible array substrate includes a first layer comprising the plurality of data connection lines 111 and the plurality of gate lines 102, and a second layer comprising the plurality of gate connection lines 122 and the plurality of data lines 101, and an insulating layer between the first layer and the second layer. As a result, the data lines 101 and the gate connection lines 122 can be formed in a same process, and the gate lines 102 and the data connection lines 111 can be formed in a same process. This structure reduces the number of layers required, simplifies the manufacturing process, saves on material and costs, and minimizes the thickness of the array substrate and the display panel. Optionally, the data connection lines 111 and the gate lines 102 are substantially parallel to each other, and the gate connection lines 122 and the data lines 102 are substantially parallel to each other. In such a structure, the data connection lines 111 and the gate lines 102 do not intersect each other, and the gate connection lines 122 and the data lines 102 do not intersect each other, resulting in a simple and uncluttered wiring design.

In some embodiments, the data lines 101 and the data connection lines 111 belong to different layers, and the gate lines 102 and the gate connection lines 122 belong to different layers. Optionally, each of the plurality of first terminals of the plurality of data connection lines 111 is connected to a corresponding data line 101 through a first via 501 in the insulating layer in a one-on-one relationship.

Optionally, each of the plurality of first terminals of the gate connection lines 122 is connected to a corresponding gate line 102 through a second via 502 in the insulating layer in a one-on-one relationship.

In some embodiments, the plurality of data connection lines 111 and the plurality of gate connection lines 122 are substantially perpendicular to each other, the plurality of data connection lines 111 are substantially parallel to the plurality of gate lines 102, and the plurality of gate connection lines 122 are substantially parallel to the plurality of data lines 101. This design avoids any intersecting or overlapping between the plurality of data connection lines 111 and the plurality of gate connection lines 122, between the plurality of data connection lines 111 and the plurality of gate lines 102, and between the plurality of gate connection lines 122 and the plurality of data lines 101. An overly cluttered wiring scheme and potential short wire can be avoided.

By having the flexible circuit bonding portion 20 abutting a portion of a periphery (e.g., only one edge) of the display portion 10 and having the terminals of the data connection lines 111 and the terminals of the gate connection lines 122 within the flexible circuit bonding portion 20, a display panel having a frame on only one portion of the periphery of the display portion can be made. For example, by having this design, three edges of the display portion can be frameless, the display panel includes a frame along only one edge of the flexible array substrate, i.e., the edge abutting the flexible circuit bonding portion.

The present disclosure also provides a display panel having a flexible array substrate described herein and a data driven control chip. The data driven control chip and the plurality of second terminals of the plurality of data connection lines 111 are connected together through the electrical terminal 30. The display portion and the flexible circuit bonding portion of the display panel approximately overlaps with the display portion 10 and the flexible circuit bonding portion 20 of the flexible array substrate, respectively. The display panel further includes other components such as other substrates necessary for the functioning of the display panel.

Figure 5:
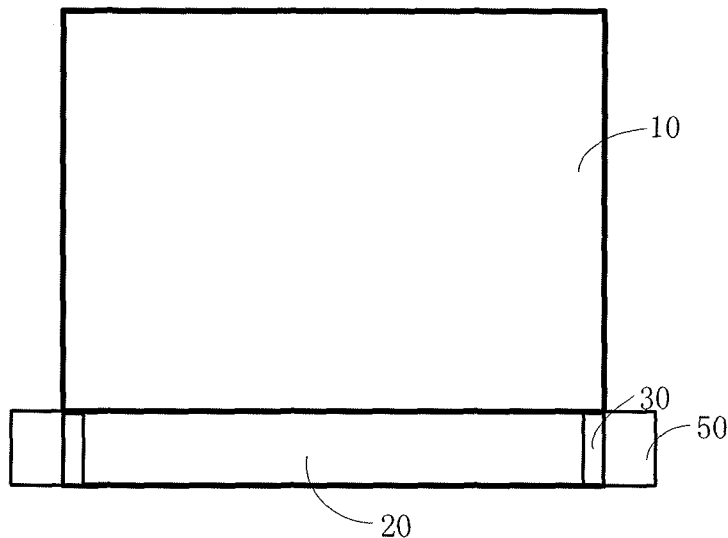
FIG. 5 is a diagram illustrating the structure of a display panel in an embodiment.

FIG. 5 is a diagram illustrating the structure of a display panel in an embodiment. Referring to FIG. 5, the data driven control chip is integrated in an external control chip 50. The flexible circuit bonding portion 20 further includes a GOA circuit. The GOA circuit is connected to a GOA signal input line. The external control chip 50 is connected to the electrical terminal 30 and the GOA signal input line through a flexible printed circuit board, respectively.

In some embodiments, the electrical terminal 30 is on one or both ends of the flexible circuit bonding portion 20. An edge of the electrical terminal 30 is coterminous with a boundary between the display portion 10 and the flexible circuit bonding portion 20. The external control chip 50 is folded behind the flexible circuit bonding portion 20. The external control chip 50 and the flexible circuit bonding portion 20 are packaged together using a flexible module. The external control chip 50 includes a contact lead wire protruding out of the flexible module for connecting with an external module. By having this structure, the total non-display portion and the total array substrate area can be reduced. Consequently the total display panel area required for achieving a same display portion area can be reduced.

By having the flexible circuit bonding portion abutting a portion of a periphery (e.g., only one edge) of the display portion, three edges of the display panel can be made frameless. The display panel described herein can be used for making a display device such as a computer, optionally a touch control display device such as a mobile phone and a flat panel computer. Optionally, the display panel can be used for making a tablet device. Optionally, the display panel can be used for making a notebook computer.

Figure 6:
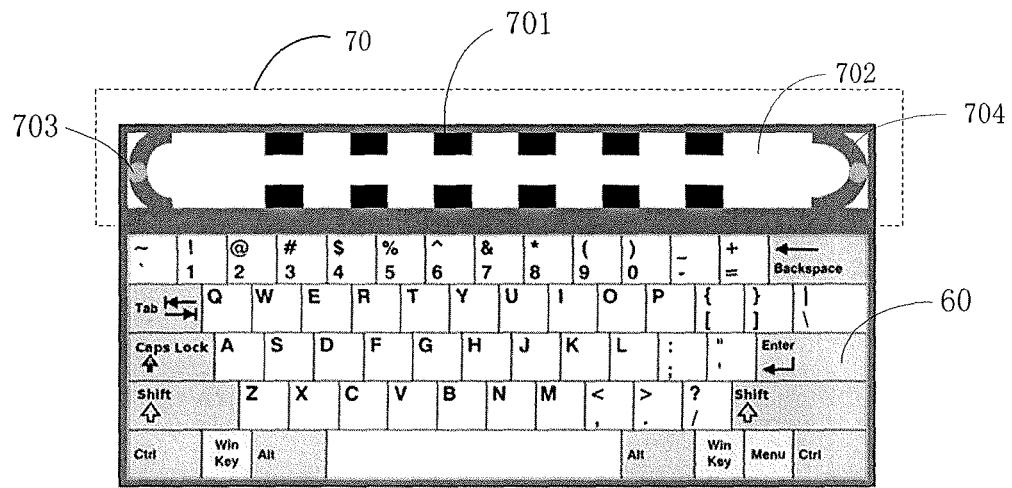
FIG. 6 is a diagram illustrating the structure of a keyboard assembly in an embodiment.

The present disclosure further provides a keyboard assembly including a keyboard portion 60 and a display connection portion 70. FIG. 6 is a diagram illustrating the structure of a keyboard assembly in an embodiment. Referring to FIG. 6, the display connection portion 70 includes a groove 702 formed between two opposing rows of pinch points 701 for receiving a flexible circuit bonding portion of a flexible array substrate.

Figure 7:
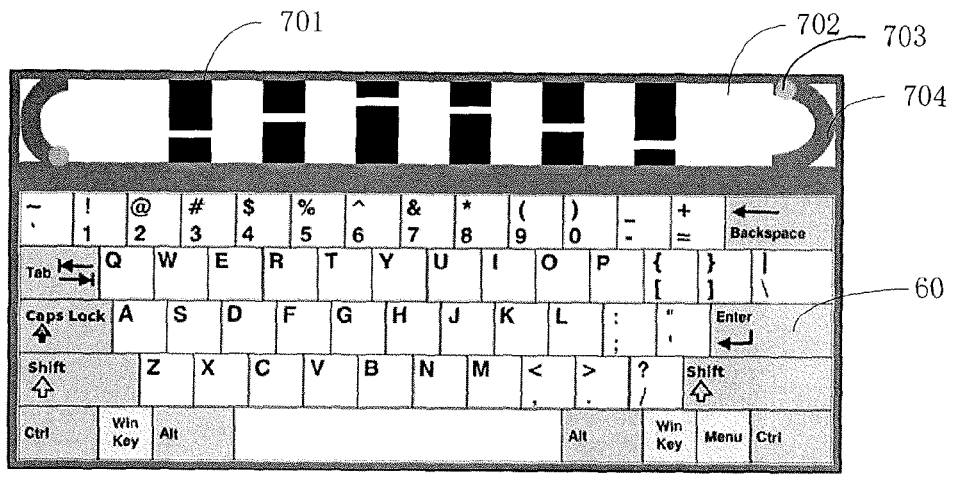
FIG. 7 is a diagram illustrating the structure of a keyboard assembly having a plurality of pairs of pinch points extendable toward each other for changing the shape of the groove.

Two rows of pinch points 701 may include pinch points 701 that are paired up. FIG. 7 is a diagram illustrating the structure of a keyboard assembly having a plurality of pairs of pinch points extendable toward each other for changing the shape of the groove. Referring to FIG. 7, the two opposing rows of pinch points 701 includes a plurality of pairs of pinch points 701 extendable toward each other for changing the shape of the groove 702.

Figure 8:
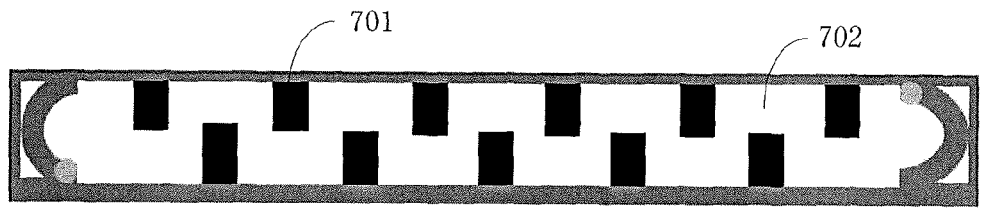
FIG. 8 is a diagram illustrating the structure of a groove formed between two opposing rows of pinch points in a keyboard assembly in another embodiment.
Figure 9:
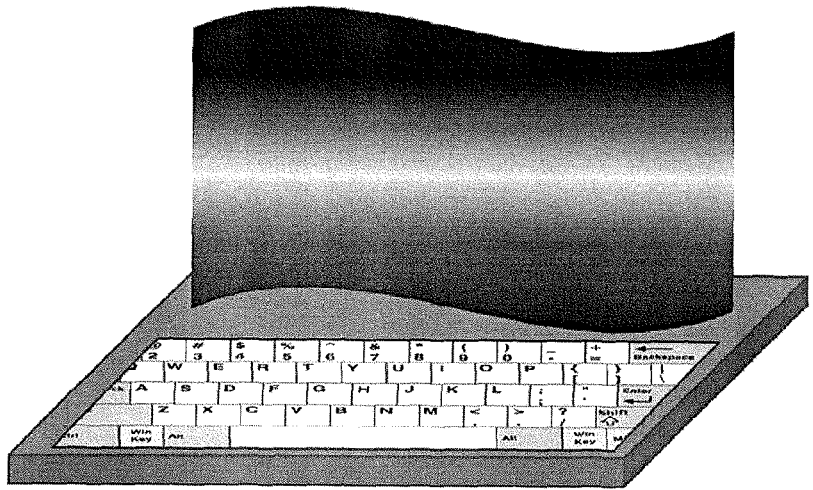
FIG. 9 is a diagram illustrating the structure of an electronic device in an embodiment.

Two rows of pinch points 701 may include pinch points 701 that are arranged in a way other than the above-mentioned "paired up" fashion. FIG. 8 is a diagram illustrating the structure of a groove formed between two opposing rows of pinch points in a keyboard assembly in another embodiment. Referring to FIG. 8, the pinch points 701 are arranged alternately on two opposing rows. The pinch points on one row are extendable toward the opposing row for changing the shape of the groove 702.

Using a keyboard assembly described herein, a display panel can be intercalated into the display connection portion 70 of the keyboard assembly. Depending on the shape of the display panel, the positions of the pinch points 701 can be changed to accommodate the display panel, and secure the display panel onto the keyboard assembly. Once secured onto the keyboard assembly, the shape of the display panel can be further changed to accommodate user needs by extending the pinch points 701 at various positions.

In some embodiments, the display connection portion 70 includes a contact lead wire receiving portion 703 for receiving a contact lead wire on two edges of the flexible circuit bonding portion 20 of the flexible array substrate.

In some embodiments, the display connection portion 70 includes an arc-shape track 704. The contact lead wire receiving portion 703 protrudes out of the arc-shape track 704 and is movable along the arc-shape track 704.

The present disclosure further provides an electronic device having a display panel and a keyboard assembly described herein.

The flexible array substrate can be made of any appropriate flexible material. In some embodiments, the flexible array substrate is a polyimide (PI) array substrate. For example, a polyimide layer can be coated on a glass substrate. Various array substrate layers and wirings can be formed on the polyimide layer. The polyimide layer is then detached from the glass substrate to form a flexible array substrate.

By having the flexible circuit bonding portion abutting a portion of a periphery (e.g., only one edge) of the display portion, it is possible to make the other three edges frameless in the flexible array substrate, the display panel assembled together with the keyboard assembly, and the electronic device. The data lines 101 and the gate connection lines 122 may be formed in a same process by having a first layer including the plurality of data connection lines 111 and the plurality of gate lines 102 substantially parallel to each other.

The gate lines 102 and the data connection lines 111 can be formed in a same process by having a second layer including the plurality of gate connection lines 122 and the plurality of data lines 101 substantially parallel to each other. This structure simplifies the manufacturing process, saves on material and costs, and minimizes the thickness of the array substrate and the display panel.

Further, the keyboard assembly having a groove formed between two opposing rows of pinch points is provided for accommodating and securing a flexible display panel of any desired shape. By changing the positions of the pinch points, the shape of the display panel can be altered based on user needs.

The present disclosure also provides an electronic device having the display panel described herein and/or the keyboard assembly described herein. In some embodiments, the electronic device can be used as a notebook computer when the display panel is assembled together with the keyboard assembly. In some embodiments, the electronic device is a tablet device when the keyboard assembly is not combined with the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible array substrate, comprising
a flexible display portion comprising a plurality of first signal lines and a plurality of second signal lines intersecting each other;
a flexible circuit bonding portion abutting the flexible display portion for bonding circuit parts; and
a plurality of first connection lines for transmitting first signals respectively to the plurality of first signal lines;
a plurality of second connection lines for transmitting second signals respectively to the plurality of second signal lines;
wherein each of the plurality of first connection lines is electrically connected to one of the plurality of first signal lines, and extends from the flexible display portion to the flexible circuit bonding portion;
each of the plurality of second connection lines is electrically connected to one of the second signal lines;
at least one of the plurality of first connection lines crosses over more than one of the plurality of first signal lines within the flexible display portion;
at least one of the plurality of first connection lines and at least one of the plurality of second connection lines cross over each other in the flexible circuit bonding portion.

2. The flexible array substrate of claim 1, wherein the plurality of first connection lines in the flexible display portion are substantially parallel to the plurality of second signal lines.

3. The flexible array substrate of claim 1, wherein the plurality of first connection lines and the plurality of second connection lines are in different layers.

4. The flexible array substrate of claim 1, wherein the plurality of first signal lines are a plurality of data lines, and the plurality of first connection lines are a plurality of data connection lines.

5. The flexible array substrate of claim 1, further comprising:
a first layer comprising the plurality of first connection lines and the plurality of second signal lines;
a second layer comprising the plurality of second connection lines and the plurality of first signal lines; and
an insulating layer between the first layer and the second layer;
wherein
a plurality of first terminals of the plurality of first connection lines are connected to the plurality of first signal lines, a plurality of second terminals of the plurality of first connection lines are in the flexible circuit bonding portion for receiving first signals;
a plurality of first terminals of the plurality of second connection lines are connected to the plurality of second signal lines, a plurality of second terminals of the second connection lines are in the flexible circuit bonding portion for receiving second signals;
each of the plurality of first terminals of the plurality of first connection lines is connected to the corresponding first signal line through a first via in the insulating layer in a one-on-one relationship; and
each of the plurality of first terminals of the second connection lines is connected to a corresponding second signal line through a second via in the insulating layer in a one-on-one relationship.

6. The flexible array substrate of claim 5, wherein the plurality of first signal lines are a plurality of data lines, the plurality of second signal lines are a plurality of gate lines, the plurality of first connection lines are a plurality of data connection line, the plurality of second connection lines are a plurality of gate connection lines;
the plurality of data lines extend along a first direction from the flexible display portion into the flexible circuit bonding portion;

the plurality of second terminals of the plurality of data connection lines are connected to a data driven control chip interface through a first electrical terminal; and the plurality of gate lines extend along a second direction; the flexible circuit bonding portion comprises a first edge and a second edge along the second direction, the first electrical terminal is on the first edge, lengths of the plurality of data lines within the flexible circuit bonding portion increase along a direction from the first edge to the second edge.

7. The flexible array substrate of claim 5, wherein the plurality of first signal lines are a plurality of data lines, the plurality of second signal lines are a plurality of gate lines, the plurality of first connection lines are a plurality of data connection line, the plurality of second connection lines are a plurality of gate connection lines;

the plurality of data lines extend along a first direction from the flexible display portion into the flexible circuit bonding portion;

the plurality of second terminals of the plurality of data connection lines are connected to a first data driven control chip interface through a first electrical terminal and a second data driven control chip interface through a second electrical terminal; and the plurality of gate lines extend along a second direction; the flexible circuit bonding portion comprises a first edge and a second edge along the second direction, the first electrical terminal is on the first edge and the second electrical terminal is on the second edge, lengths of the plurality of data lines within the flexible circuit bonding portion decrease along a direction from a center of the flexible circuit bonding portion to the first edge and to the second edge, respectively.

8. The flexible array substrate of claim 6, wherein the flexible circuit bonding portion comprises a gate-driver on array (GOA) circuit, the plurality of gate connection lines are substantially parallel to the plurality of data lines, the plurality of second terminals of the plurality of gate connection lines are connected to the GOA circuit, the GOA circuit is connected to a GOA signal input line, and the GOA signal input line is substantially parallel to the plurality of data connection lines.

9. The flexible array substrate of claim 5, wherein the plurality of first signal lines are a plurality of data lines, the plurality of second signal lines are a plurality of gate lines, the plurality of first connection lines are a plurality of data connection line, the plurality of second connection lines are a plurality of gate connection lines;

the plurality of gate lines extend along a first direction from the flexible display portion toward the flexible circuit bonding portion;

each of the plurality of data connection lines has a substantially L shape, comprising a first segment and a second segment substantially perpendicular to each other; and a plurality of the first segments are substantially parallel to the plurality of gate lines and extending into the flexible display portion, each of the plurality of the first segments is connected to the corresponding data line through a first via in the insulating layer in a one-on-one relationship.

10. The flexible array substrate of claim 9, wherein the plurality of the second segments comprises the plurality of second terminals of the plurality of data connection lines, and the plurality of second terminals of the plurality of data connection lines are connected to a data driven control chip interface through a first electrical terminal; and the plurality of data lines extend along a second direction; the flexible circuit bonding portion comprises a first edge and a second edge along the second direction, the first electrical terminal is on the first edge, lengths of the plurality of the first segments and the plurality of the second segments within the flexible circuit bonding portion increase along a direction from the first edge to the second edge.

11. The flexible array substrate of claim 9, wherein the plurality of the second segments comprises the plurality of second terminals of the plurality of data connection lines, and the plurality of second terminals of the plurality of data connection lines are connected to a first data driven control chip interface through a first electrical terminal and a second data driven control chip interface through a second electrical terminal;

the plurality of data lines extend along a second direction; the flexible circuit bonding portion comprises a first edge and a second edge along the second direction, the first electrical terminal is on the first edge and the second electrical terminal is on the second edge, lengths of the plurality of the first segments and the plurality of the second segments within the flexible circuit bonding portion decrease along a direction from a center of the flexible circuit bonding portion to the first edge and the second edge.

12. The flexible array substrate of claim 9, wherein the flexible circuit bonding portion comprises a GOA circuit, the plurality of second terminals of the plurality of gate connection line are connected to the GOA circuit, the GOA circuit is connected to a GOA signal input line, and the GOA signal input line is substantially parallel to the plurality of data connection lines.

13. A display panel comprising a flexible array substrate of claim 1 and a data driven control chip, wherein the data driven control chip is connected to the plurality of second terminals of a plurality of data connection lines through an electrical terminal.

14. The display panel of claim 13, wherein the data driven control chip is integrated in an external control chip, the flexible circuit bonding portion comprises a GOA circuit, the GOA circuit is connected to a GOA signal input line, the external control chip is connected through flexible printed circuit boards to the electrical terminal and to the GOA signal input line, respectively.

15. The display panel of claim 14, wherein the flexible circuit bonding portion has the electrical terminal on one or both ends, an edge of the electrical terminal is coterminous with a boundary between the flexible display portion and the flexible circuit bonding portion, the external control chip is folded behind the flexible circuit bonding portion, the external control chip and the flexible circuit bonding portion are packaged together using a flexible module, and the external control chip comprises a contact lead wire protruding out of the flexible module for connecting with an external module.

16. A keyboard assembly, comprising:
a keyboard portion; and
a display connection portion comprising a groove formed between two opposing rows of pinch points for receiving a flexible circuit bonding portion of a flexible array substrate of claim 1.

17. The keyboard assembly of claim 16, wherein the two opposing rows of pinch points comprise a plurality of pairs of pinch points extendable toward each other for changing the shape of the groove.

18. The keyboard assembly of claim 16, wherein the display connection portion comprises a contact lead wire receiving portion for receiving a contact lead wire on two edges of the flexible circuit bonding portion of the flexible array substrate.

19. The keyboard assembly of claim 17, wherein the display connection portion comprises an arc-shape track, the contact lead wire receiving portion protruding out of the arc-shape track and is movable along the arc-shape track.

20. An electronic device comprising a display panel of claim 15 and a keyboard assembly of claim 16.

\* \* \* \* \*